United States Patent [19]

Wenz

[11] Patent Number: 4,888,061
[45] Date of Patent: Dec. 19, 1989

[54] THIN-FILM SOLAR CELLS RESISTANT TO DAMAGE DURING FLEXION

[75] Inventor: Robert P. Wenz, Cottage Grove, Minn.

[73] Assignee: Minnesota Mining and Manufacturing Company, St. Paul, Minn.

[21] Appl. No.: 239,513

[22] Filed: Sep. 1, 1988

[51] Int. Cl.$^4$ .................... H01L 31/04; H01L 31/18
[52] U.S. Cl. .................... 136/251; 136/245; 136/259; 437/2; 437/211; 437/219; 357/72; 29/841
[58] Field of Search ........................ 437/2–5, 437/51, 211, 219; 156/99, 166; 136/245, 251, 259; 357/72; 361/398; 428/901, 913; 29/841

[56] References Cited

U.S. PATENT DOCUMENTS

| | | | |
|---|---|---|---|
| 3,780,424 | 12/1973 | Forestieri et al. | 29/572 |
| 4,043,834 | 8/1977 | Rüsch | 136/245 |
| 4,057,439 | 11/1977 | Lindmayer | 136/251 |
| 4,140,142 | 2/1979 | Dormidontov et al. | 136/246 |
| 4,154,998 | 5/1979 | Luft et al. | 219/10.49 R |
| 4,166,876 | 9/1979 | Chiba et al. | 428/215 |
| 4,219,926 | 9/1980 | Bloch et al. | 29/832 |
| 4,296,270 | 10/1981 | Köhler | 136/244 |
| 4,370,509 | 1/1983 | Dahlberg | 136/244 |
| 4,379,324 | 5/1983 | Thompson | 362/253 |
| 4,383,130 | 5/1983 | Uroshevich | 136/261 |
| 4,401,710 | 8/1983 | Bansemir et al. | 428/229 |
| 4,410,558 | 10/1983 | Izu et al. | 427/39 |
| 4,419,530 | 12/1983 | Nath | 136/251 |
| 4,574,160 | 3/1986 | Cull et al. | 136/245 |
| 4,605,813 | 8/1986 | Takeuchi et al. | 136/244 |
| 4,609,770 | 9/1986 | Nishiura et al. | 136/244 |
| 4,617,420 | 10/1986 | Dilts et al. | 136/244 |
| 4,754,544 | 7/1988 | Hanak | 437/2 |
| 4,773,944 | 9/1988 | Nath et al. | 136/249 |

FOREIGN PATENT DOCUMENTS

| | | | |
|---|---|---|---|
| 2160345 | 12/1973 | Fed. Rep. of Germany . | |
| 57-755534 | 5/1982 | Japan . | |
| 57-192016 | 11/1982 | Japan . | |
| 60-214550 | 10/1985 | Japan | 136/251 |
| 61-42662 | 3/1986 | Japan . | |

Primary Examiner—Aaron Weisstuch
Attorney, Agent, or Firm—Kinney & Lange

[57] ABSTRACT

An improved method for manufacturing solar cell tape including depositing a thin-film photovoltaic device on a flexible polymeric substrate, encapsulating the photovoltaic device with a layer of encapsulant, and applying a layer of adhesive to the substrate opposite the photovoltaic device. The improvement is characterized by selecting thickness of the substrate, layer of encapsulant and/or layer of adhesive as a function of their respective flexural moduli to locate a neutral plane of the electronic device near the photovoltaic device. Damaging stress on the photovoltaic device which may be caused when the electronic device is flexed can be reduced.

22 Claims, 2 Drawing Sheets

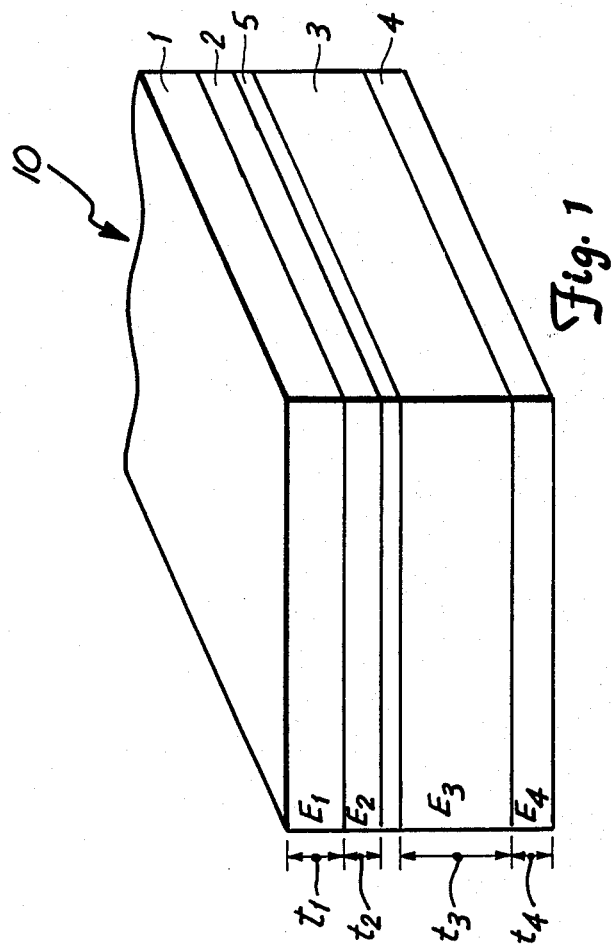

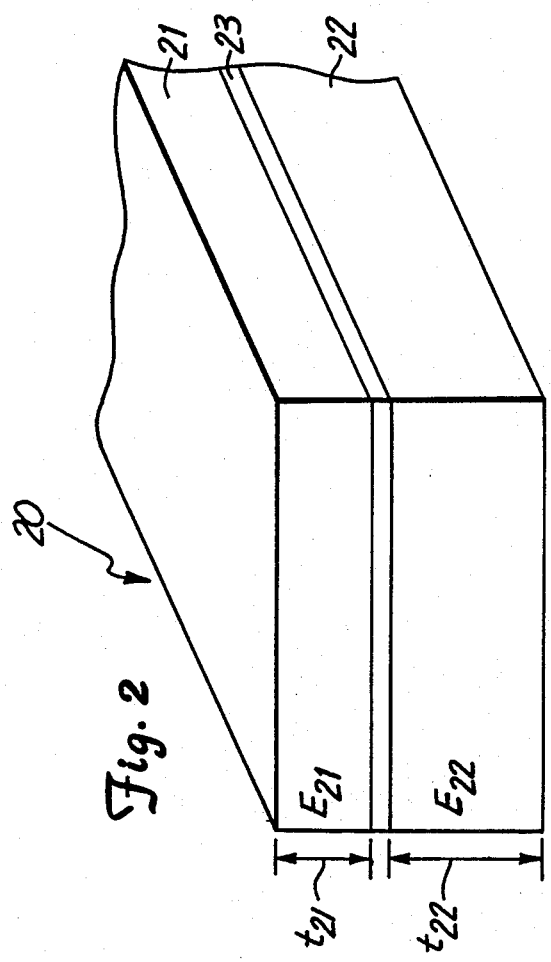

THIN-FILM SOLAR CELLS RESISTANT TO DAMAGE DURING FLEXION

BACKGROUND OF THE INVENTION

1. Field of the Invention

The present invention relates generally to the manufacture of electronic devices. In particular, the present invention is a method for manufacturing flexible thin-film electronic devices to prevent stress on the layer of semiconductor material when the circuit is flexed.

2. Description of the Prior Art

Electronic devices are well known and can be manufactured using any of a number of known techniques. Thin-film solar cells, for example, can be inexpensively manufactured by depositing layers of semiconductor material on flexible substrates using glow discharge deposition and roll-to-roll processing techniques. Continuous roll processing on flexible, aluminum, stainless steel, tantalum, molybdenum, chrome, polyimide-coated stainless steel and polyimide substrates is known. Since solar cells fabricated on these substrates are flexible, they can be mounted to nonplanar objects. In an embodiment described in application Ser. No. 07/165,488, entitled "Light-Rechargeable Battery", filed Mar. 8, 1988 and assigned to the same assignee as the present invention, flexible solar cells are mounted to the cylindrical surface of a battery so as to recharge the battery when it is positioned in ambient light.

Thin-film solar cells are flexed and bent when rolled up following their manufacture or applied to nonplanar articles. One side of the flexed solar cell will be subjected to compressive forces while the opposite side will be stretched and placed in tension. If the semiconductor region or layer forming the solar cell photovoltaic device is at a location which is placed in either tension or compression, its electrical and physical properties can be detrimentally affected. it is known that bond distances in the semiconductor material can be altered and broken by these forces. The result is reduced solar cell efficiency.

SUMMARY OF THE INVENTION

The present invention is an improved method for manufacturing electronic devices of the type having a flexible substrate, a layer of semiconductor material on the substrate, and an encapsulant layer over the semiconductor material. The improvement is characterized by selecting thickness of the flexible substrate and/or the encapsulant layer as a function of the elastic moduli of the substrate and encapsulant layer so that the neutral plane (neutral stress/strain plane) of the electronic device is located near the layer of semiconductor material. Damaging stresses on the layer of semiconductor material are thereby prevented when the electronic devices is flexed.

BRIEF DESCRIPTION OF THE DRAWINGS

FIG. 1 is an illustration of a strip of solar cell tape manufactured in accordance with the present invention.

FIG. 2 is an illustration of a solar cell manufactured in accordance with the present invention.

DETAILED DESCRIPTION OF THE PREFERRED EMBODIMENTS

An electronic device such as a strip of solar cell tape 10 manufactured in accordance with the present invention is illustrated generally in FIG. 1. Solar cell tape 10 includes a thin-film semiconductor photovoltaic device 5 fabricated on a flexible substrate 3. An upper or active surface of photovoltaic device 5, the surface opposite substrate 3, is encapsulated by an optically transparent glazing 1. A layer of adhesive 2 can be used to bond glazing 1 to photovoltaic device 5. A layer of adhesive 4 is applied to a lower surface of substrate 3, opposite photovoltaic device 5. Solar cell tape 10 can thereby be adhesively affixed to a variety of objects. During manufacture, the thickness of glazing 1, layers of adhesive 2 and 4, and substrate 3 are selected as a function of their flexural or elastic moduli so the neutral plane of solar cell tape 10 is located at the plane in which photovoltaic device 5 is located. Subsequent flexing of solar cell tape 10, as for example when it is rolled after manufacture or applied to a nonplanar article, will therefore result in minimal amounts of stress to photovoltaic device 5 and prevent detrimental flexion-caused physical and electrical effects.

Known manufacturing techniques including chemical vapor deposition during roll-to-roll processing can be used to fabricate photovoltaic device 5 on substrate 3. Substrate 3 can be any flexible substrate having electrical and physical properties appropriate for the intended application. Conductive substrates such as thin stainless steel and insulating substrates such as polyimide are commonly used. In one embodiment photovoltaic device 5 is an amorphous silicon device fabricated on a polyimide substrate 3. Transparent glazing 1 can be any of a wide variety of known polymeric, solar cell encapsulants such as polyethylene, polypropylene, polyester, poly(methyl) methacrylate (PMMA), ethyl vinyl acetate, or butyl acrylate. Glazing 1 can be bonded to photovoltaic device 5 using any known adhesive 2 having appropriate optical and electrical properties. In one embodiment an impact-modified PMMA layer of glazing 1 is bonded to photovoltaic device 5 using a silicone-based or acrylic-based layer of adhesive 2. In other embodiments (not shown). transparent glazing 1 can be direct-coated or thermal-bonded to photovoltaic device 5 without the need for a layer of adhesive 2. Adhesive 4 can be any known adhesive, such as pressure sensitive adhesives (PSAs), having appropriate properties.

As shown in FIG. 1, transparent glazing 1, layer of adhesive 2, substrate 3, and layer of adhesive 4 are all characterized by an elastic or flexural modulus $E_1$, $E_2$, $E_3$, and $E_4$, and a thickness $t_1$, $t_2$, $t_3$, and $t_4$, respectively. Elastic moduli, also known as Young's moduli, are measures of the stiffness of the materials. Elastic moduli $E_1$–$E_4$ (i.e., $E_1$, $E_2$, $E_3$ and/or $E_4$) characterize the ratio of stress to corresponding strain when the associated material behaves elastically. Typical or characteristic elastic moduli E for a variety of materials are listed below:

STAINLESS STEEL: $30 \times 10^6$ psi
POLYMERS: $1 \times 10^3 - 1 \times 10^6$ psi
POLYIMIDE: $3 \times 10^5$ psi
GLAZING: $1 \times 10^3 - 1 \times 10^5$ psi The present invention is based upon the realization that by selecting the thicknesses $t_1$–$t_4$ (i.e., $t_1$, $t_2$, $t_3$ and/or $t_4$) of the associated layers of materials 1–4 (i.e., materials 1, 2, 3 and/or 4) as a function of their respective elastic moduli $E_1$–$E_4$, solar cell tape 10 can be manufactured with its neutral (stress/strain) plane or moment located at the layer of photovoltaic device 5. Subsequent flexing of solar cell tape 10 will then result in no stress or strain within photovoltaic device 5, even as the layers of materials 1-4 on opposite sides of photovoltaic device 5 are subject to tensile and compressive forces. Electrical and physical characteristics of photovoltaic device 5 will therefore be unaffected when solar cell tape 10 is flexed, rolled or mounted to a nonplanar object. Although optimum effects are achieved when the neutral plane is located at the plane of device 5, advantages are clearly obtained even if the neutral plane is positioned only near photovoltaic device 5. In general, if the neutral plane is positioned near the plane of device 5, to within a distance of twenty percent (e.g., ten percent, five percent, or two percent) of the overall thickness of solar cell tape 10 (i.e. the sum of thicknesses $t_1-t_4$), significant advantages are obtained.

The neutral plane $\bar{y}$ of a multilayer article such as solar cell tape 10 is located using the principle of moments described by Equation 1.

$$\bar{y} = \frac{\Sigma E_i t_i y_i}{\Sigma E_i t_i} \qquad \text{Eq. 1}$$

where
$\bar{y}$ = location of neutral plane;
$E_i$ = elastic modulus of layer i;
$t_i$ = thickness of layer i;
$y_i$ = distance of center of layer i from a reference point; and
$\Sigma$ indicates summation over the i layers.

Using Equation 1, the neutral plane $\bar{y}$ of solar cell tape 10 with respect to photovoltaic device 5 (e.g. $\bar{y} = 0$ = center of device 5) is described by Equation 2.

$$\bar{y} = 0 = [E_1 t_1 (t_2 + t_1/2) + E_2 t_2 (t_2/2) - E_3 t_3 (t_3/2) - E_4 t_4 (t_3 t_4/2)] / E_1 t_1 + E_2 t_2 + E_3 t_3 + E_4 t_4 \qquad \text{Eq. 2}$$

Equation 2 is based upon the assumption that the thickness of photovoltaic device 5 is much less than any of thicknesses $t_1-t_4$. For neutral plane $\bar{y}$ to be located in the plane of photovoltaic device 5, e.g. between layers of adhesive 2 and substrate 3, the numerator in Equation 2 must be zero. This relationship can be described by Equation 3.

$$E_1 t_1 (t_2 + t_1/2) + E_2 t_2 (t_2/2) - E_3 t_3 (t_3/2) - E_4 t_4 (t_3 + t_4/2) = 0 \qquad \text{Eq. 3}$$

Using Equation 3, $t_1-t_4$ of layers of material 1-4 can be selected as a function of their respective elastic moduli $E_1-E_4$ to place the neutral plane of solar cell tape 10 within the plane of photovoltaic device 5. Known manufacturing techniques such as those described above can be controlled to produce solar cell tape 10 with materials 1-4 having the selected thicknesses $t_1-t_4$, respectively.

A special case exists when elastic moduli $E_1$, $E_2$, and $E_4$, of respective layers of material 1, 2 and 4 are equal to one another and much less than the elastic moduli $E_3$ of substrate 3, and the thicknesses $t_1$, $t_2$ and $t_4$ of layers of material 1, 2 and 4 are substantially equal to a constant thickness $t_C$. In this case the thickness $t_3$ of substrate 3 which will place the neutral plane of solar cell tape 10 in the plane of photovoltaic device 5 can be computed as a function of elastic moduli $E_C$, $E_3$ and thickness $t_C$, as described in Equation 4.

$$t_3 = (3E_C/E_3) t_c \qquad \text{Eq. 4}$$

where:
$E_1 \simeq E_2 \simeq E_4 \simeq E_C << E_3$
$t_1 \simeq t_2 \simeq t_4 = t_C$ Solar cell tape 20, which can also be manufactured in accordance with the present invention, is illustrated generally in FIG. 2. Solar cell tape 20 includes a photovoltaic device 23 fabricated on substrate 22. Photovoltaic device 23 is encapsulated on the side opposite substrate 22 by a layer of transparent adhesive/glazing 21. Adhesive/glazing 21 is characterized by a flexural modulus $E_{21}$ and a thickness $t_{21}$. Substrate 22 is characterized by a flexural modulus $E_{22}$ and a thickness $t_{22}$. Substrate 22 and photovoltaic device 23 can be identical to their counterparts described with reference to solar cell tape 10. Pressure sensitive adhesives can be used for adhesive/glazing 21.

The position of neutral plane $\bar{y}$ of solar cell tape 20 is given by Equation 5.

$$\bar{y} = [E_{21} t_{21} (t_{21}/2) - E_{22} t_{22} (t_{22}/2)] / E_{21} t_{21} + + E_{22} t_{22} \qquad \text{Eq. 5}$$

Setting neutral plane $\bar{y}$ equal to zero, the position of the neutral plane with respect to the plane in which photovoltaic device 23 lies is described by Equation 6 below.

$$t_{22} = (E_{21}/E_{22}) t_{21} \qquad \text{Eq. 6}$$

Solar cell tapes such as 10 and 20 manufactured in accordance with the present invention can be used in a wide variety of applications. In one embodiment solar cell tape 10 is used in conjunction with a light-rechargeable battery such as that described in application Ser. No. 07/165,488, filed Mar. 8, 1988 and assigned to the same assignee as the present invention. Other applications include light-powered decorator wall/outdoor clocks, calculators and other light-powered electronic device applications. Solar cell tape 20 can be adhesively secured to the interior of automotive or other glass and used to power a variety of electrical devices or rechargeable batteries. Since the neutral plane of these devices is located at the plane of the photovoltaic device, they can be rolled following manufacture and/or mounted to nonplanar objects without detrimentally affecting the physical and electrical characteristics of the device.

Although the present invention has been described with reference to preferred embodiments, workers skilled in the art will recognize that changes may be made in form and detail without departing from the spirit and scope of the invention.

What is claimed is:

1. In a method for manufacturing an electronic device of the type having a flexible substrate, a layer of semiconductor material on the substrate, and an encapsulant layer over the semiconductor material opposite the substrate; the improvement characterized by selecting thickness of the flexible substrate and/or encapsulant layer as a function of elastic moduli of the substrate and encapsulant layer so a neutral plane of the electronic device is located near the layer of the semiconductor material to prevent damaging stress on the layer of semiconductor material when the electronic device is flexed.

2. The method of claim 1 wherein the improvement is characterized by selecting thickness of the flexible substrate and/or encapsulant layer so the neutral plane of the electronic device is located within twenty percent of an overall thickness of the electronic device from the layer of semiconductor material.

3. The method of claim 1 wherein the improvement is characterized by selecting thickness of the flexible substrate and/or encapsulant layer so the neutral plane of the electronic device is located within ten percent of an overall thickness of the electronic device from the layer of semiconductor material.

4. The method of claim 1 and selecting thickness of the flexible substrate and encapsulant layer so the neutral plane of the electronic device is located within five percent of an overall thickness of the electronic device from the layer of semiconductor material.

5. The method of claim 1 and selecting thickness of the flexible substrate and encapsulant layer so the neutral plane of the electronic device is located within two percent of an overall thickness of the electronic device from the layer of semiconductor material.

6. An electronic device manufactured in accordance with the method of claim 1.

7. In a method for manufacturing an electronic device of the type having a flexible substrate, a layer of semiconductor material on the substrate, and an encapsulant layer over the semiconductor material opposite the substrate; the improvement characterized by selecting thickness of the flexible substrate and/or encapsulant layer as a function of elastic moduli of the substrate and encapsulant layer so a neutral plane of the electronic device is located at the layer of the semiconductor material to prevent damaging stress on the layer of semiconductor material when the electronic device is flexed.

8. In a method for manufacturing solar cell tape including depositing a thin-film photovoltaic device on a flexible polymeric substrate, encapsulating the photovoltaic device with a layer of encapsulant, and applying a layer of adhesive to the substrate opposite the photovoltaic device, the improvement characterized by selecting thickness of the substrate, layer of encapsulant and/or layer of adhesive as a function of their respective flexural moduli to locate a neutral plane of the solar cell tape near the photovoltaic device to prevent damaging stress on the photovoltaic device when the solar cell tape is flexed.

9. The method of claim 8 wherein the improvement is characterized by selecting thickness of the flexible substrate, layer of encapsulant and/or layer of adhesive so the neutral plane of the solar cell tape is located within twenty percent of an overall thickness of the solar cell tape from the photovoltaic device.

10. The method of claim 8 and selecting thickness of the flexible substrate, layer of encapsulant and/or layer of adhesive so the neutral plane of the solar cell tape is located within ten percent of an overall thickness of the solar cell tape from the photovoltaic device.

11. The method of claim 8 and selecting thickness of the flexible substrate, layer of encapsulant and/or layer of adhesive so the neutral plane of the solar cell tape is located within five percent of an overall thickness of the solar cell tape from the photovoltaic device.

12. The method of claim 8 and selecting the thickness of the flexible substrate, layer of encapsulant and/or layer of adhesive so the neutral plane of the solar cell tape is located within two percent of an overall thickness of the solar cell tape from the photovoltaic device.

13. A solar cell tape manufactured in accordance with the method of claim 8.

14. In a method for manufacturing solar cell tape including depositing a thin-film photovoltaic device on a flexible polymeric substrate, encapsulating the photovoltaic device with a layer of encapsulant, and applying a layer of adhesive to the substrate opposite the photovoltaic device, the improvement characterized by selecting thickness of the substrate, layer of encapsulant and/or layer of adhesive as a function of their respective flexural moduli to locate the neutral plane of the solar cell tape at the photovoltaic device to prevent damaging stress on the photovoltaic device when the solar cell tape is flexed.

15. A flexible electronic device including:
a flexible substrate having a thickness and characterized by an elastic modulus;
a layer of semiconductor material on the substrate; and
an encapsulant layer, having a thickness and characterized by an elastic modulus, over the semiconductor material opposite the substrate, wherein a neutral plane of the electronic device characterized by the thicknesses and elastic moduli of the substrate and encapsulant layer is located near the layer of the semiconductor material to prevent damaging stress on the layer of semiconductor material when the electronic device is flexed.

16. The electronic device of claim 15 wherein the neutral plane is located within ten percent of the overall thickness of the electronic device from the layer of semiconductor material.

17. The method of claim 16 wherein the neutral plane of the electronic device is located within five percent of the overall thickness of the electronic device from the layer of semiconductor material.

18. A flexible electronic device including:
a flexible substrate having a thickness and characterized by an elastic modulus;
a layer of semiconductor material on the substrate; and
an encapsulant layer having a thickness and characterized by an elastic modulus over the semiconductor material opposite the substrate, wherein a neutral plane of the electronic device characterized by the thicknesses and and elastic moduli of the substrate and encapsulant layer is located at the layer of the semiconductor material to prevent damaging stress on the layer of semiconductor material when the electronic device is flexed.

19. A strip of solar cell tape including:
a flexible polymeric substrate having a thickness and characterized by an elastic modulus;
a thin-film photovoltaic device on the substrate;
a layer of encapsulant having a thickness and characterized by an elastic modulus encapsulating the photovoltaic device; and
a layer of adhesive having a thickness and characterized by an elastic modulus on the substrate opposite the photovoltaic device, wherein a neutral plane of the solar cell tape characterized by the thicknesses and elastic moduli of the substrate, layer of encapsulant and layer of adhesive is located near the photovoltaic device to prevent damaging stress on the photovoltaic device when the solar cell tape is flexed.

20. The solar cell tape of claim 19 wherein the neutral plane is located within ten percent of an overall thickness of the tape from the photovoltaic device.

21. The solar cell tape of claim 19 wherein the neutral plane is located within five percent of an overall thickness of the tape from the photovoltaic device.

22. A strip of solar cell tape including:
a flexible polymeric substrate having a thickness and characterized by an elastic modulus;
a thin-film photovoltaic device on the substrate;
a layer of encapsulant having a thickness and characterized by an elastic modulus encapsulating the photovoltaic device; and
a layer of adhesive having a thickness and characterized by an elastic modulus on the substrate opposite the photovoltaic device, wherein a neutral plane of the solar cell tape characterized by the thicknesses and elastic moduli of the substrate, layer of encapsulant and layer of adhesive is located at the photovoltaic device to prevent damaging stress on the photovoltaic device when the solar cell tape is flexed.

* * * * *

UNITED STATES PATENT AND TRADEMARK OFFICE
CERTIFICATE OF CORRECTION

PATENT NO. : 4,888,061

DATED : December 19, 1989

INVENTOR(S) : Robert P. Wenz

It is certified that error appears in the above-identified patent and that said Letters Patent is hereby corrected as shown below:

Column 5, line 10, delete "and" and insert --and/or--.

Column 5, line 15, delete "and" and insert --and/or--.

Signed and Sealed this

Thirtieth Day of October, 1990

Attest:

HARRY F. MANBECK, JR.

*Attesting Officer*  *Commissioner of Patents and Trademarks*